(12) United States Patent
Keil et al.

(10) Patent No.: US 8,289,026 B2
(45) Date of Patent: Oct. 16, 2012

(54) RECORDING DEVICE FOR RECORDING THE SWITCH STATE OF AN ELECTROMAGNETIC SWITCH DEVICE

(75) Inventors: Rainer Keil, Nürnberg (DE); Helmut Kraus, Kümmersbruck (DE); Stefan Langen, Kümmersbruck (DE); Wolfgang Schatz, Amberg (DE)

(73) Assignee: Siemens Aktiengesellschaft, Munich (DE)

( * ) Notice: Subject to any disclaimer, the term of this patent is extended or adjusted under 35 U.S.C. 154(b) by 452 days.

(21) Appl. No.: 12/448,891

(22) PCT Filed: Jan. 9, 2008

(86) PCT No.: PCT/EP2008/050157
§ 371 (c)(1),
(2), (4) Date: Jul. 14, 2009

(87) PCT Pub. No.: WO2008/087074
PCT Pub. Date: Jul. 24, 2008

(65) Prior Publication Data
US 2010/0060287 A1  Mar. 11, 2010

(30) Foreign Application Priority Data
Jan. 15, 2007 (DE) .......................... 10 2007 002 176

(51) Int. Cl.
*G01R 31/327* (2006.01)
*H01H 9/00* (2006.01)
(52) U.S. Cl. ....................................... 324/415; 324/418
(58) Field of Classification Search .......................... None
See application file for complete search history.

(56) References Cited

U.S. PATENT DOCUMENTS

| 4,467,300 A | 8/1984 | Harbauer |
| 5,523,684 A * | 6/1996 | Zimmermann .......... 324/207.22 |
| 5,886,607 A * | 3/1999 | Ricker .......................... 335/255 |
| 6,646,529 B1 * | 11/2003 | Kahnert et al. ............... 335/229 |
| 2002/0139650 A1 | 10/2002 | Suss et al. |

FOREIGN PATENT DOCUMENTS

| DE | 3117914 A1 | 11/1982 |
| DE | 19506168 A1 | 8/1996 |
| DE | 19605974 A1 * | 8/1997 |
| DE | 29712392 U1 | 9/1997 |
| DE | 19918577 A1 | 8/2000 |
| DE | 10009499 C1 | 9/2001 |
| EP | 1246218 A2 | 10/2002 |
| WO | WO 9206483 A1 | 4/1992 |
| WO | WO 9805052 A1 | 2/1998 |

* cited by examiner

*Primary Examiner* — Paresh Patel
(74) *Attorney, Agent, or Firm* — Harness, Dickey & Pierce, P.L.C.

(57) ABSTRACT

A recording device is for recording the switch state of an electromagnetic switch device. In at least one embodiment, the recording device includes a housing, in which a plunger is movably mounted. The plunger may be moved between two mechanical end positions, wherein the end positions of the plunger correspond to the switch states of the electromagnetic switch device. A sensor device is arranged in the housing by which it may be recorded in which of the end positions the plunger is and from which a corresponding electrical signal may be emitted. The sensor device is designed to be able to record the position of the plunger without contacting the plunger.

15 Claims, 1 Drawing Sheet

RECORDING DEVICE FOR RECORDING THE SWITCH STATE OF AN ELECTROMAGNETIC SWITCH DEVICE

PRIORITY STATEMENT

This application is the national phase under 35 U.S.C. §371 of PCT International Application No. PCT/EP2008/050157 which has an International filing date of Jan. 9, 2008, which designated the United States of America, and which claims priority on German patent application number DE 10 2007 002 176.5 filed Jan. 15, 2007, the entire contents of each of which are hereby incorporated herein by reference.

FIELD

At least one embodiment of the present invention generally relates to a detection apparatus for detecting the switching state of an electromagnetic switching device. In at least one embodiment, it relates to a detection apparatus having the following features:
  It has a housing in which a plunger is movably mounted.
  The plunger can be moved between two mechanical end positions, wherein the end positions of the plunger correspond to the switching state of the electromagnetic switching device.

BACKGROUND

Electromagnetic switching devices, within the meaning of embodiments of the present invention, include electric contactors, isolating switches, line relays, power switches, etc. In the case of such electromagnetic switching devices, in particular electric contactors, it is necessary in a multiplicity of applications to detect the actual switching state of the electromagnetic switching device—as opposed to a control state of the electromagnetic switching device where applicable—in order to be able to analyze the switching state in another way.

According to the prior art, a detection of the kind takes place by way of a detection apparatus as described above. In this case there is disposed in the housing a mechanical switching contact which changes its switching state when the plunger is transferred from one end position to the other end position. The switching contact is connected to an analysis apparatus via lines, such that the switching position of the switching contact and hence the switching state of the electromagnetic switching device can be detected by the analysis apparatus. The detection apparatus is usually a separate apparatus (called an auxiliary switch) which is different from the switching device.

The prior art approach usually works very well already. It is, though, capable of improvement. In particular, the reliability of the detection apparatus can be increased.

SUMMARY

At least one embodiment of the present invention is directed to a detection apparatus in such a way that it operates with increased reliability.

In at least one embodiment, a detection apparatus of at least one embodiment has at least the following features:
  A sensor apparatus is disposed in the housing, said sensor apparatus being able to detect in which of the end positions the plunger is located and to emit an electrical signal which corresponds to said end position.

The sensor apparatus is embodied such that it is able to detect the position of the plunger without touching it.

At least one embodiment of the detection apparatus ensures in particular that the sensor apparatus is not exposed to the jerky, hard movements of the plunger. In particular it can therefore be embodied smaller and lighter in weight than in the prior art, and operate more quickly.

In at least one embodiment, it is possible for a pickup interface to be disposed on the housing, the interface being accessible from outside the housing and allowing the electrical signal that is emitted by the sensor apparatus to be immediately picked up as such. It is, however, preferred for a conditioning circuit to be disposed in the housing, the circuit conditioning the electrical signal emitted by the sensor apparatus into a message and outputting the message via a communication interface. This last-cited embodiment can be realized as an alternative or in addition to the direct pickup of the electrical signal emitted by the sensor apparatus.

A printed circuit board is preferably disposed in the housing and the sensor apparatus arranged thereon. This results in the production of the detection apparatus being made simpler in manufacturing terms.

The sensor apparatus is preferably embodied as an electronic sensor apparatus which has no moving parts. By virtue of this embodiment it is possible on the one hand to increase the reliability and service life of the sensor apparatus, and on the other hand to integrate and miniaturize the sensor apparatus.

The housing and the plunger can be coordinated in such a way that it is possible to identify visually from outside the housing in which of the end positions the plunger is located. In this case the switching state of the electromagnetic switching device can not only be reported to the outside by electrical or electronic device(s), but can also be identified directly from the outside by a person.

It is possible for the detection apparatus to be part of the electromagnetic switching device per se. As a rule, however, the housing of the detection apparatus is a different housing from the housing of the electromagnetic switching device, and the plunger of the detection apparatus is usually a different plunger from the plunger of the electromagnetic switching device. In this case the housing of the detection apparatus can be fixed to the housing of the electromagnetic switching device. The plunger of the detection apparatus can be connected to the plunger of the electromagnetic switching device in this case such that the plunger of the detection apparatus moves in concert with the plunger of the electromagnetic switching device.

BRIEF DESCRIPTION OF THE DRAWINGS

Further advantages and details will emerge from the following description of an example embodiment in conjunction with the drawings, in which.

DETAILED DESCRIPTION OF THE EXAMPLE EMBODIMENTS

Figure 1:
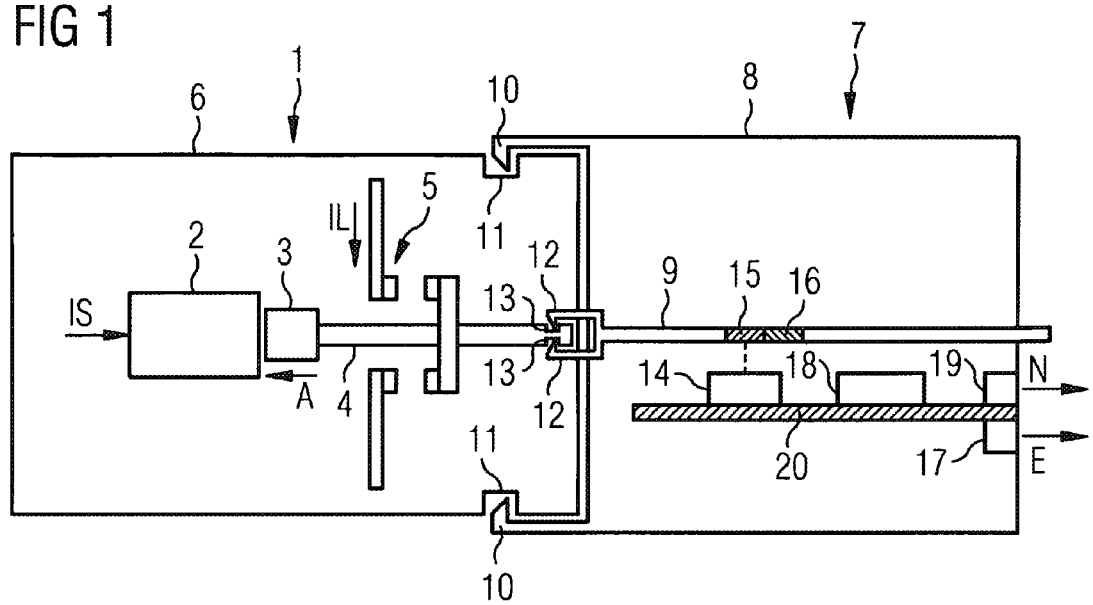
FIG. 1 schematically shows the design structure of an electromagnetic switching device and a detection apparatus, and FIG. 2 schematically shows an electrical block diagram of the detection apparatus.

According to FIG. 1, an electromagnetic switching device 1 is embodied as an electric contactor. It has a coil 2 to which a switching current IS can be applied. When the switching current IS is applied to the coil 2, the latter attracts an armature 3. This is indicated by an arrow A in FIG. 1. When the switching current IS is interrupted, the armature 3 moves away from the coil 2 due to a restoring spring force.

A plunger 4 is connected to the armature 3. Consequently, the plunger 4 is also attracted by the coil 2 together with the armature 3. Owing to the movement of the plunger 4, a load contact 5 (of which there is at least one) is closed, with the result that a load current IL can flow. Conversely, the load contact 5 is opened again when the switching current IS is interrupted.

The electromagnetic switching device 1 typically has a plurality of load contacts 5, e.g. three, four or five load contacts 5. It is purely for the purpose of greater clarity of illustration that only one load contact 5 is depicted in FIG. 1.

The embodiment of the electromagnetic switching device illustrated in FIG. 1 is not the only possible embodiment. The electromagnetic switching device 1 could alternatively be embodied as a power switch, for example. In this case the switching current IS is identical to the load current IL. The coil 2 in this case attracts the armature 3 if the load current IL becomes too great. Owing to the armature 3 being attracted a breaker mechanism is released which moves the plunger 4 into a position in which the load contact 5 remains open.

Irrespective of the specific embodiment of the electromagnetic switching device 1, the electromagnetic switching device 1 has a housing 6 which encloses the other aforementioned elements 2 to 5 of the electromagnetic switching device 1. Also irrespective of the specific embodiment of the electromagnetic switching device 1, the position of the plunger 4 corresponds to the switching state of the load contact 5 and hence to the switching state of the electromagnetic switching device 1.

In order that the switching state of the electromagnetic switching device 1 can be detected, a detection apparatus 7 is provided. The detection apparatus 7, which will be described in further detail below, can be part of the electromagnetic switching device 1. According to FIG. 1, however, it is embodied as an add-on device which is placed onto the electromagnetic switching device 1. According to FIG. 1, the detection apparatus 7 therefore has a housing 8 which is different from the housing 6 of the electromagnetic switching device 1. Furthermore, the detection apparatus 7 has a plunger 9 which is different from the plunger 4 of the electromagnetic switching device 1.

In the present case, in which the detection apparatus 7 is embodied as an add-on device, the housing 8 of the detection apparatus 7 can be fixed to the housing 6 of the electromagnetic switching device 1. In FIG. 1, this is indicated by snap-fit engagement hooks 10 which are disposed on the housing 8 of the detection apparatus 7 and interact with engagement recesses 11 which are disposed on the housing 6 of the electromagnetic switching device 1. However, the detection apparatus 7 does not have to be fixed to the electromagnetic switching device 1 by means of a snap-fit connection. It can alternatively or additionally be secured in a different way, e.g. by way of screw connections.

The plunger 9 of the detection apparatus 7 is movably mounted in the housing 8 of the detection apparatus 7. The plunger 9 of the detection apparatus 7 can be connected to the plunger 4 of the electromagnetic switching device 1. Here, too, it is possible for snap-fit engagement hooks 12 to be disposed on, for example, the plunger 9 of the detection apparatus 7 and to interact with engagement recesses 13 which are disposed on the plunger 4 of the electromagnetic switching device 1. Another type of connection is also possible here, however. The essential provision is that the plunger 9 of the detection apparatus 7 moves together with the plunger 4 of the electromagnetic switching device 1.

To the extent that the electromagnetic switching device 1 and the detection apparatus 7 have been described hereintofore, the structure corresponds to the structure that is generally known from the prior art. In particular, the plunger 9 of the detection apparatus 7 can be moved between two mechanical end positions. Owing to the connection of the plunger 9 of the detection apparatus 7 to the plunger 4 of the electromagnetic switching device 1, the end positions of the plunger 9 of the detection apparatus 7 correspond to the switching state of the electromagnetic switching device 1.

According to an embodiment of the invention, however, a sensor apparatus 14 is disposed in the housing 8 of the detection apparatus 7. The sensor apparatus 14 is able to detect in which of the end positions the plunger 9 of the detection apparatus 7 is located. The sensor apparatus 14 is able to emit an electrical signal E which corresponds to the detected end position. According to an embodiment of the invention, the sensor apparatus 14 is embodied in such a way that it can detect the position of the plunger 9 of the detection apparatus 7 without touching the plunger 9 of the detection apparatus 7.

Figure 2:
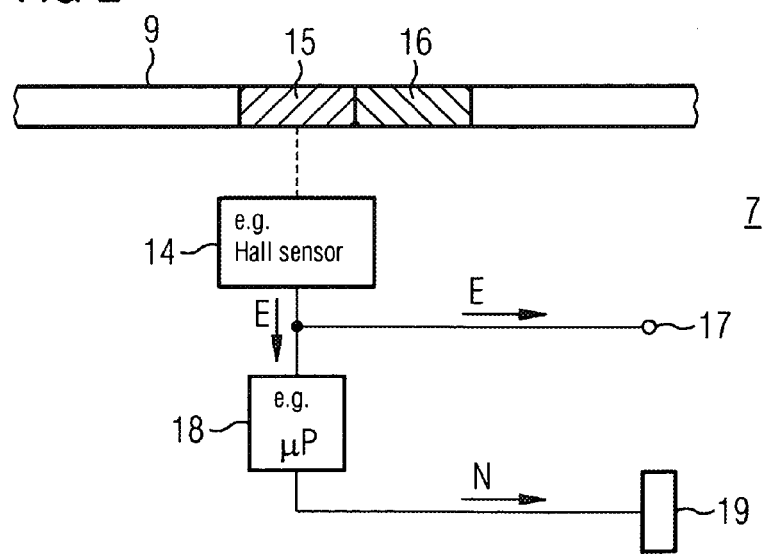

According to FIG. 2, the sensor apparatus 14 can be realized as a Hall sensor, for example. In this case, sections 15, 16 of the plunger 9 of the detection apparatus 7, which are located in the effective range of the sensor apparatus 14 in one of the end positions of the plunger 9 of the detection apparatus 7 in each case, must be embodied such that they are magnetically different. For example, the sections 15, 16 can have mutually opposite magnetization.

In the case of the embodiment as a Hall sensor, the sensor apparatus 14 detects the magnetic field. However, other embodiments are alternatively conceivable. For example, the sensor apparatus 14 can be embodied as an inductive or capacitive proximity switch, or as a proximity switch which is based on ultrasound. Alternatively again, the sensor apparatus 14 can be embodied as an optical detection apparatus which detects in which of the end positions the plunger 9 of the detection apparatus 7 is located on the basis of transmitted or reflected light. The plunger 9 of the detection apparatus 7 must, of course, have a corresponding design in the case of each of these embodiments.

In the case of the above-described embodiments of the sensor apparatus 14, the sensor apparatus 14 is embodied as an electronic sensor apparatus 14. It has no moving parts in this case. Alternatively, however, the sensor apparatus 14 could also have moving parts. This would be the case, for example, if the sensor apparatus 14 were embodied as a reed relay or as a switching element that is otherwise magnetomechanically activated.

The detected switching state or, as the case may be, the electrical signal E corresponding thereto, is usually required to be emitted externally. In the simplest case a pickup interface 17 is disposed on the housing 8 of the detection apparatus 7 for this purpose. The pickup interface 17 is usually accessible from outside the housing 8 of the detection apparatus 7. The electrical signal E can be immediately and directly picked up as such via the pickup interface 17; see FIG. 2 in particular.

Alternatively or in addition to the presence of the pickup interface 17, it is possible for a conditioning circuit 18 to be disposed in the housing 8 of the detection apparatus 7. The conditioning circuit 18 is connected to the sensor apparatus 14. It conditions the electrical signal E into a message N and outputs the message N via a communication interface 19. The communication interface 19 can be embodied for example as a bus interface, a point-to-point interface or a wireless connection. Like the pickup interface 17, it is preferably disposed on the housing 8 of the detection apparatus 7 and accessible from outside the housing 8 of the detection apparatus 7.

According to FIG. 1, a printed circuit board 20 is disposed in the housing 8 of the detection apparatus 7. The components of the detection apparatus 7, i.e. at least the sensor apparatus 14, are disposed on the printed circuit board 20. If present, the conditioning circuit 18 is also disposed on the printed circuit board 20. If applicable, the pickup interface 17 and/or the communication interface 19 can also be disposed on the printed circuit board 20.

The electrical functionality of the above-described detection apparatus 7 is entirely satisfactory. In addition, however, the housing 8 of the detection apparatus 7 and the plunger 9 of the detection apparatus 7 can also be coordinated in such a way that the end position in which the plunger 9 of the detection apparatus 7 is located can be identified visually from outside the housing 8 of the detection apparatus 7. The coordination can be such that, for example, the plunger 9 of the detection apparatus 7 is dimensioned and mounted in the housing 8 of the detection apparatus 7 in such a way that the plunger 9 (see FIG. 1) projects out of the housing 8 of the detection apparatus 7 when the load contact 5 is open.

Alternatively or additionally, for example, an opening or a viewing window could be incorporated in the housing 8 of the detection apparatus 7, such that a marker which is disposed on the plunger 9 of the detection apparatus 7 is visible from the outside in exactly one of the end positions of the plunger 9 of the detection apparatus 7.

The housing 8 of the detection apparatus 7 is preferably coordinated with the plunger 9 of the detection apparatus 7 in such a way that it is also possible visually to identify in which of the end positions the plunger 9 of the detection apparatus 7 is located when the housing 8 of the detection apparatus 7 is fixed to the housing 6 of the electromagnetic switching device 1.

The above description serves solely to explain the present invention. The scope of protection of the present invention, in contrast, is to be determined exclusively by the appended claims.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A detection apparatus for detecting a switching state of an electromagnetic switching device, the detection apparatus comprising:
   a housing;
   a plunger, connected to the electromagnetic switching device and movably mounted in the housing based on switching states of the electromagnetic switching device;
   a sensor apparatus, in the housing, to detect a position of the plunger and to emit an electrical signal corresponding to the detection, the sensor apparatus being able to detect the position of the plunger without touching the plunger; and
   a pickup interface, on the housing and accessible from outside the housing, to allow the electrical signal, emitted by the sensor apparatus, to be immediately picked up as such.

2. The detection apparatus as claimed in claim 1, further comprising:
   a printed circuit board, in the housing, the sensor apparatus being on the printed circuit board.

3. The detection apparatus as claimed in claim 1, wherein the sensor apparatus is an electronic sensor apparatus which has no moving parts.

4. The detection apparatus as claimed in claim 1, wherein the housing and the plunger are coordinated such that the position of the plunger is visually identifiable from outside the housing.

5. The detection apparatus as claimed in claim 4, wherein, when the housing of the detection apparatus is fixed to a housing of the electromagnetic switching device, the position of the plunger is visually identifiable from outside the housing of the detection apparatus.

6. The detection apparatus as claimed in claim 1, further comprising:
   a conditioning circuit, in the housing, to condition the electrical signal, emitted by the sensor apparatus, into a message and to output the message via a communication interface.

7. The detection apparatus as claimed in claim 1, wherein the housing is fixable to a housing of the electromagnetic switching device and wherein the plunger is connectable to a plunger of the electromagnetic switching device such that the plunger moves together with the plunger of the electromagnetic switching device.

8. The detection apparatus as claimed in claim 7, wherein, when the housing of the detection apparatus is fixed to the housing of the electromagnetic switching device, the position of the plunger is visually identifiable from outside the housing of the detection apparatus.

9. A detection apparatus for detecting a switching state of an electromagnetic switching device, the detection apparatus comprising:
   a housing;
   a plunger, connected to the electromagnetic switching device and movably mounted in the housing based on switching states of the electromagnetic switching device;
   a sensor apparatus, in the housing, to detect a position of the plunger and to emit an electrical signal corresponding to the detection, the sensor apparatus being able to detect the position of the plunger without touching the plunger; and
   a conditioning circuit, in the housing, to condition the electrical signal, emitted by the sensor apparatus, into a message and to output the message via a communication interface.

10. The detection apparatus as claimed in claim 9, further comprising:
    a printed circuit board, in the housing, the sensor apparatus being on the printed circuit board.

11. The detection apparatus as claimed in claim 9, wherein the sensor apparatus is an electronic sensor apparatus which has no moving parts.

12. The detection apparatus as claimed in claim 9, wherein the housing and the plunger are coordinated such that the position of the plunger is visually identifiable from outside the housing.

13. The detection apparatus as claimed in claim 12, wherein, when the housing of the detection apparatus is fixed to a housing of the electromagnetic switching device, the position of the plunger is visually identifiable from outside the housing of the detection apparatus.

14. A detection apparatus for detecting a switching state of an electromagnetic switching device, the detection apparatus comprising:

a housing, fixable to a housing of the electromagnetic switching device;

a plunger, movably mounted in the housing, the plunger connectable to a plunger of the electromagnetic switching device such that the plunger moves together with the plunger of the electromagnetic switching device based on switching states of the electromagnetic switching device;

a sensor apparatus, in the housing, to detect a position of the plunger and to emit an electrical signal corresponding to the detection, the sensor apparatus being able to detect the position of the plunger without touching the plunger.

15. The detection apparatus as claimed in claim 14, wherein, when the housing is fixed to the housing of the electromagnetic switching device, the position of the plunger is visually identifiable from outside the housing.

* * * * *